United States Patent [19]
Nuttall et al.

[11] Patent Number: 5,578,505
[45] Date of Patent: Nov. 26, 1996

[54] METHODS FOR MEASURING THE SURFACE AREA OF A SEMICONDUCTOR WAFER

[75] Inventors: Michael Nuttall, Meridian; Kelly Hurley, Boise, both of Id.

[73] Assignee: Micron Technology, Inc., Boise, Id.

[21] Appl. No.: 573,331

[22] Filed: Dec. 15, 1995

[51] Int. Cl.[6] .......................... H01L 21/66; H01L 21/306; G01B 21/28
[52] U.S. Cl. ................ 437/8; 156/626.1; 427/8; 73/23.2; 73/29.01
[58] Field of Search .................... 437/8, 235; 156/626.1; 427/8; 73/23.2, 29.01

[56] References Cited

U.S. PATENT DOCUMENTS 3,549,368  12/1970  Collins et al. ........................... 96/35.1

FOREIGN PATENT DOCUMENTS 3148162  6/1991  Japan .............................. H01L 23/50
4179249  6/1992  Japan .............................. H01L 21/66

*Primary Examiner*—Robert Kunemund
*Assistant Examiner*—Matthew Whipple
*Attorney, Agent, or Firm*—Workman Nydegger & Seeley

[57] ABSTRACT

Methods for measuring the surface area of a top region of a silicon wafer by initially depositing a monolayer of hexamethyldisilizane over the surface area of the silicon wafer. The silicon wafer is then positioned within a vacuum environment. Next, oxygen is introduced into the vacuum chamber so that the HMDS substantially reacts with the oxygen to form products such as carbon dioxide and water. At least one of the water and the carbon dioxide are measured from the known volume of the vacuum chamber. Based on the amount of product formed, the amount of HMDS covering the surface area is determined. Finally, from the amount of HMDS calculated to be originally positioned on the surface area, a value for the surface area is determined.

20 Claims, 1 Drawing Sheet

METHODS FOR MEASURING THE SURFACE AREA OF A SEMICONDUCTOR WAFER

BACKGROUND OF THE INVENTION

1. The Field of the Invention

The present invention relates to methods for measuring the surface area of a semiconductor wafer and, more specifically, to methods for measuring the surface area of a semiconductor wafer having a varied topography.

2. The Relevant Technology

Integrated circuits are manufactured by an elaborate process in which a variety of different electronic devices are integrally formed on a small silicon wafer. Conventional electronic devices include capacitors, resistors, transistors, diodes, and the like. In advanced manufacturing of integrated circuits, hundreds of thousands of electronic devices are formed on a top region of a single silicon wafer.

The variety of electronic devices making up an integrated circuit are formed through a series of layering and stripping steps. By selectively combining layers of conductive, non-conductive, and semi-conductive material, each of the different electronic devices can be formed. As the different electronic devices are formed, the topography of the silicon wafer changes. That is, at select times in the fabrication process, the integrated circuit may comprise a variety of different trenches, plateaus, contact holes, islands, or other structures having a varied height and size. As these different structures are formed, the overall surface area of the silicon wafer changes.

The ability to determine the surface area of a silicon wafer at any given time in the fabrication process is becoming more important as the size of integrated circuits become smaller and more dense. For example, one of the processes used for depositing a layer of material over a silicon wafer is chemical vapor deposition (CVD). In one CVD method, a selected material is reacted in a furnace to form molecules in a vapor state. A gas is then used to transfer the molecules down a long heated tube where the silicon wafers are stored. As the gas passes by the silicon wafers, the molecules are deposited onto the surface area of the silicon wafer until a film of a desired thickness is obtained.

One problem encountered in this CVD process is that as the molecules within the gas are deposited on the first wafers in the tube, the concentration of molecules in the gas decreases. In turn, this decreases the rate of molecular deposition on subsequent wafers. As such, the thickness of the deposited material varies along the length of the tube. This problem is referred to as depletion.

By knowing the surface area of each wafer, it is possible to determine the rate at which the molecules are deposited on the silicon wafers and thus depleted from the gas. Knowing this information, variables such as the gas flow rate and temperature along the tube can be altered to produce a more uniform deposition on the silicon wafers.

Knowing the surface area of a silicon wafer is also useful in determining the properties of a capacitor. The capacitance or effectiveness of a capacitor is dependent on the surface area of the capacitor. In one use, the surface area of the capacitor is roughened so as to increase the surface area of the capacitor without increasing the overall surface area on the silicon wafer that the capacitor uses. The ability to know the total surface area of a silicon wafer is useful in determining the actual surface area and thus the capacitance of each capacitor.

Ascertaining the surface area of a silicon wafer is also useful in determining the depth of a trench. Trenches are formed during the fabrication of integrated circuits. It is often important to know the depth of a trench so that subsequent steps can be properly performed. Historically, the depth of a trench has been determined by inserting a probe within the trench. Today, however, trenches are becoming increasingly small, which makes the probe insertion depth determining technique increasingly difficult. Further, the probe insertion technique may be inadequate for determining all dimensions across the topography of a silicon wafer necessary to accurately determining the surface area of the silicon wafer. Importantly, knowledge of the topography of the structures on the silicon wafer are integral to determining the total surface area of the silicon wafer.

Determining the total surface area of a silicon wafer can also be used in monitoring quality control. For example, by comparing the theoretical surface area of a silicon wafer to the actual surface area of the silicon wafer, the determination can be made as to whether there are any significant defects on the silicon wafer.

OBJECTS AND BRIEF SUMMARY OF THE INVENTION

Accordingly, it is an object of the present invention to provide methods for determining the surface area of a silicon wafer.

More specifically, it is an object of the present invention to provide methods for determining the surface area of a silicon chip having a varying topography.

Another object of the present invention is to provide methods for determining the surface area and thus the capacitance of a capacitor formed on a silicon wafer.

Another object of the present invention is to provide methods for determining the depth of trenches or contact holes on the surface of a silicon wafer.

It is also another object of the present invention to provide methods for providing a more uniform deposition on a silicon wafer during chemical vapor deposition processes.

Another object of the present invention is to provide methods for determining the planarity of a silicon wafer.

Finally, it is another object of the present invention to provide methods for determining defects on the surface area of a silicon wafer.

In order to achieve the forgoing objects, and in accordance with the invention as embodied and broadly described herein, a method is provided for measuring the surface area of a top region of a semiconductor wafer. The method comprises the initial step of depositing a layer of a monolayering material over the top region of the semiconductor wafer. A monolayering material has the property of forming a layer of approximately one molecule thick when deposited upon the top region of a semiconductor wafer.

The wafer is then placed into an environment of known volume that is free of air, excess monolayering material other than that forming the monolayer on the wafer, and substances capable of reacting with the layer of monolayering material. Next, a reactant is introduced into the environment of the wafer. The reactant reacts with substantially all of the layer of the monolayering material to form one or more reaction products. A quantity of one or more of the reaction products formed within the environment of known volume is then measured. The measured quantity of reaction product, with the stoichiometry of the reactants, is then used to determine the corresponding surface area of the top region of the semiconductor wafer.

By way of example, and not by way of limitation, the wafer can be a silicon wafer, and the layer of monolayering material over the top region of the silicon wafer can be hexamethyldisilizane (HMDS). HMDS has the property of depositing on a surface of a silicon wafer in a layer that is believed to be approximately one molecule thick. That is, it is believed that the molecules of the HMDS do not predominately stack one on top of each other but are dispersed side by side so as to form a thin layer that is approximately one molecule thick.

Once the HMDS is deposited substantially over the top region of the silicon wafer, the silicon wafer is positioned into a vacuum environment of known volume. More specifically, the silicon wafer is positioned in a vacuum chamber in which all air and possible reactants are removed.

Next, oxygen is introduced into the vacuum environment so that the oxygen reacts with substantially all of the HMDS in the vacuum chamber. The monolayer of HMDS reacts with the oxygen to form a plurality of different products. These products include carbon dioxide and water. The quantity of at least $CO_2$ and water is measured in the vacuum chamber. For example, the carbon dioxide can be measured by a $CO_2$ measuring device, and a humidity sensor can be used to measure water content. By knowing the defined volume of the vacuum chamber and the concentration of the carbon dioxide, and/or water, stoichiometry of the reaction can next be used to calculate the amount of HMDS that was on the surface area of the silicon wafer.

Finally, knowing the amount of HMDS that was positioned on the silicon wafer, and knowing the volume of HMDS that covers a defined area of a silicon wafer, the corresponding area of the silicon wafer can be determined.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
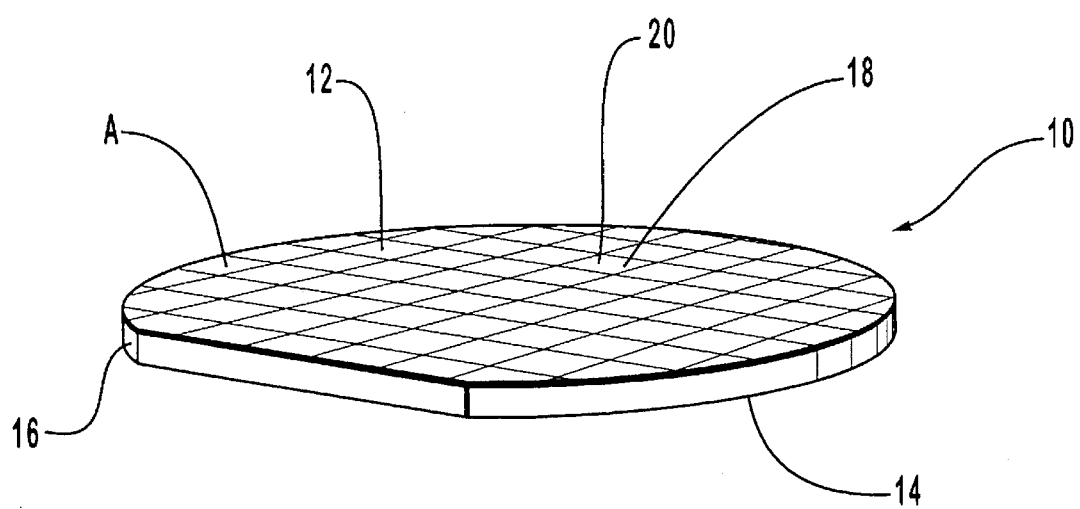
FIG. 1 is a perspective view of a silicon wafer having a top region.

Depicted in FIG. 1 is a perspective view of a silicon wafer 10 having a top region 12, a bottom region 14, and an annular sidewall 16. Top region 12 is divided into a plurality of silicon chips 18 each having an integrated circuit 20 partially constructed thereon.

The present invention relates to methods for determining a surface area A, seen in FIG. 1, of top region 12. As used in the specification and appended claims, surface A is defined as including the surface area of each structure formed on top region 20. As such, surface area A incorporates the surface area of each integrated circuit 12. As the topography of each integrated circuit 20 varies, so does surface area A. By way of example and not by way of limitation, assuming each integrated circuit 20 had a trench with opposing sidewalls and a floor, a computation of surface area A would include the surface area of the opposing sidewalls and the floor.

The first step in determining surface area A is to deposit a monolayering material over surface area A. As used in the specification and appended claims, the term "monolayering material" is defined to include all inorganic and organic materials that can be deposited in a substantially uniform layer having a thickness of about one molecule. By way of example and not by way of limitation, one preferred monolayering material is hexamethyldisilizane (HMDS) having the formula $(CH_3)_3SiNHSi(CH_3)_3$ and the following structure:

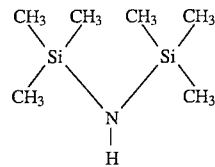

It is believed that the deposition of HMDS on a silicon wafer forms a substantially one molecule thick layer of HMDS. This is believed to occur because the HMDS has a polar end and a nonpolar end. It is appreciated that it may be difficult if not impossible to prove whether HMDS deposits in exactly a one molecule thick layer. It is known, however, that HMDS deposits in a layer sufficiently thin and uniform for purposes of the present invention.

The monolayering material is preferably deposited using a conventional vapor priming process. In vapor priming, the HMDS is introduced in vapor from into a chamber containing silicon wafers. An exposure of the wafer surfaces to the HMDS vapor for approximately 10 minutes primes the surface with the HMDS. This is substantially the same process that HMDS is deposited as a primer for the adhesion of photoresist material. The use of HMDS as an adhesive material is described in U.S. Pat. No. 3,549,368, entitled Process For Improving Photoresist Adhesion, to R. H. Collins and F. T. Deverse and is incorporated herein by reference. Of course, alternative deposition processes can also be used.

Depending on the complexity of the topography of top region 12, it may be necessary to allow the monolayering material sufficient time to migrate so as to layer upon a substantial portion of the topography of the silicon wafer surface prior to further processing. For example, to layer a deep narrow trench formed on top region 12, a predetermined period of time may be required to allow the monolayering material to adequately migrate and cover all of the surface area of the trench. The rate of migration and the adhesion of the HMDS is also dependent on the surface properties of the silicon wafer. More specifically whether the surface is a polysilicon or an oxide.

Once the monolayering material is positioned over substantially all of the surface area of top region 12 of silicon wafer 10, silicon wafer 10 is positioned within an environment of known volume. In the preferred embodiment, silicon wafer 10 is positioned within a chamber after which the air and any potential reactant with HMDS is removed therefrom. It is also preferable to remove from the chamber all HMDS other than that which forms the monolayer on the wafer. Such removal may be, for instance, by applying a vacuum to the chamber. Alternatively, an inert gas may be introduced into the chamber to exclude the air and other materials that can potentially react with the HMDS on top region 12 of silicon wafer 10.

Next, a reactant is introduced within the vacuum chamber so as to react with the monolayering material and form at least one product. A sufficient amount of the reactant is introduced within the vacuum chamber to allow substantially all of the monolayering material to react. In the preferred embodiment where HMDS is the monolayering material, oxygen ($O_2$) is used as the reactant that reacts with the HMDS. The products formed from the reaction of oxygen and HMDS include carbon dioxide and water. More specifically, it is believed that the chemical reaction for the HMDS and oxygen is essentially as follows:

$$23O_2 + 2(CH_3)_3SiNHSi(CH_3)_3 \rightarrow 12CO_2 + 4SiO_2 + 2NO_2 + 5H_2O$$

Once the products are formed, a selected product or products are measured. For example, a $CO_2$ monitor can be used to measure the concentration of $CO_2$ within the vacuum chamber. Alternatively, other types of conventional devices can be used to measure the concentration of water vapor within the known volume of the vacuum chamber.

Using the above-identified reaction equation in conjunction with the volume of the vacuum chamber and concentration of one or more of the products, for example, carbon dioxide or water, it is possible using conventional stoichiometric calculations to determine the amount of HMDS that covered surface area A of top region 12 of silicon wafer 10.

The volume per area at which HMDS is deposited on a silicon wafer is a constant given the same vapor deposition conditions and that the surface of the silicon wafer is the same material. Accordingly, the constant of volume per area can be determined by empirical studies. As a result, by knowing the amount of HMDS that is deposited on surface area A and knowing the constant of volume per area at which HMDS is deposited on the defined silicon wafer 10, simple mathematics can be used to determine the value of surface area A. Although HMDS may not deposit in exactly a one molecule layer, HMDS does deposit in a layer sufficiently uniform so that if it is known that a first silicon wafer has 1.5 times as much HMDS as a second silicon wafer, the first silicon wafer has 1.5 times the surface area as the second silicon wafer.

While HMDS as a monolayering substance for silicon wafer surfaces has been disclosed herein, this invention anticipates that additional monolayering substances for semiconductor wafers, beyond those already in the art, will be come known. As the art progresses, compositions not yet available but satisfying the definition or carrying out the functional equivalent of the monolayering material for a semiconductor wafer surface may be discovered. All such alterative compositions are intended to fall within the scope of the present invention.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for measuring the surface area of a top region of a semiconductor wafer, the method comprising the steps of:

(a) depositing a monolayering material over the top region of the semiconductor wafer;

(b) positioning the semiconductor wafer within a chamber of known volume;

(c) exposing the monolayering material positioned in the chamber to a reactant that reacts with substantially all of the monolayering material to form at least one product;

(d) measuring the quantity of the at least one product formed in the reaction of the reactant with the monolayering material; and (e) determining the corresponding surface area of the top region of the semiconductor wafer from the quantity of the at least one product formed in the reaction of the reactant with the monolayering material in the known volume of the chamber.

2. A method as recited in claim 1, wherein the positioning step further includes the step of removing from the chamber substantially all materials that react with the monolayering material.

3. A method as recited in claim 1, wherein the monolayering material is an organic material.

4. A method as recited in claim 1, wherein the monolayering material is HMDS.

5. A method as recited in claim 1, wherein the depositing step comprises vapor priming of the monolayering material onto the surface area of the top region of the semiconductor wafer.

6. A method as recited in claim 1, wherein the top region of the semiconductor wafer has a varied topography.

7. A method as recited in claim 4, wherein the reactant is oxygen.

8. A method as recited in claim 1, wherein the exposing step comprises delivering a quantity of oxygen to the chamber to permit substantially all of the layer of HMDS to react with the oxygen.

9. A method as recited in claim 1, wherein the reactant reacting with substantially all of the monolayering material forms a plurality of products, and wherein the measuring step measures more than one product of the plurality of products formed in the reaction to determine in the determining step the corresponding surface area of the top region of the semiconductor wafer from the measured more than one product of the plurality of products.

10. A method as recited in claim 1, wherein the product is carbon dioxide.

11. A method as recited in claim 1, wherein the product is water.

12. A method as recited in claim 1, wherein the semiconductor wafer is a silicon wafer.

13. A method for measuring the surface area of a top region of a silicon wafer, the method comprising the steps of:

(a) depositing a layer of HMDS over the top region of the silicon wafer;

(b) positioning the silicon wafer within a chamber of known volume;

(c) exposing the layer of HMDS positioned in the chamber to oxygen to react with substantially all of the layer of HMDS to form at least one product;

(d) measuring the quantity of the at least one product formed in the reaction of oxygen and the layer of HMDS; and (e) determining the surface area of the top region of the silicon wafer from the quantity of the at least one product formed in the known volume of the chamber.

14. A method as recited in claim 13, wherein the positioning step further includes the step of removing from the chamber substantially all materials that react with the layer of HMDS.

15. A method as recited in claim 13, wherein the at least one product is carbon dioxide.

16. A method as recited in claim 13, where the at least one product is water.

17. A method as recited in claim 13, wherein the HMDS is deposited using vapor deposition.

18. A method as recited in claim 13, wherein the at least one product is both carbon dioxide and water, and wherein the determining step determines the surface area of the top region of the silicon wafer from the measured quantities of both carbon dioxide and water formed in the known volume of the chamber.

19. A method for measuring the surface area of a top region of a semiconductor wafer, the method comprising the steps of:

(a) depositing a monolayering material over the top region of the semiconductor wafer, wherein the top region of the semiconductor wafer has a varied topography;

(b) removing from a chamber of known volume substantially all reactants that react with the monolayering material;

(c) positioning the semiconductor wafer within the chamber;

(d) exposing the monolayering material positioned in the chamber to a reactant that reacts with substantially all of the monolayering material to form at least one product;

(e) measuring the quantity of the at least one product formed in the reaction of the reactant with the monolayering material; and (f) determining the corresponding surface area of the top region of the semiconductor wafer from the quantity of the at least one product formed in the reaction of the reactant with the monolayering material in the known volume of the chamber.

20. A method as recited in claim 19, wherein the reactant reacting with substantially all of the monolayering material forms a plurality of products, and wherein the measuring step measures more than one product of the plurality of products formed in the reaction to determine in the determining step the corresponding surface area of the top region of the semiconductor wafer from said measured more than one product of the plurality of products.

* * * * *

UNITED STATES PATENT AND TRADEMARK OFFICE
CERTIFICATE OF CORRECTION

PATENT NO. : 5,578,505
DATED : November 26, 1996
INVENTOR(S) : Michael Nuttall, et al.

It is certified that error appears in the above-identified patent and that said Letters Patent is hereby corrected as shown below:

Col. 4, line 21, "(CH3)3SiNHSi(CH3)3" should be --(CH3)3Si N H Si(CH3)3--
Col. 4, line 42, "from" should be --form--
Col. 5, line 22, "23O2+2(CH3)3SiNHSi(CH3)3" should be
--23 O2 +2(CH3)3Si N H Si(CH3)3--

Signed and Sealed this

Twenty-third Day of September, 1997

Attest:

BRUCE LEHMAN

Attesting Officer

Commissioner of Patents and Trademarks